(12) United States Patent
Sakai

(10) Patent No.: US 10,692,823 B2
(45) Date of Patent: Jun. 23, 2020

(54) SEMICONDUCTOR DEVICE, SEMICONDUCTOR DEVICE MANUFACTURING METHOD, AND ELECTRONIC DEVICE

(71) Applicant: SONY CORPORATION, Tokyo (JP)

(72) Inventor: Kiyohisa Sakai, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/098,110

(22) PCT Filed: Mar. 27, 2017

(86) PCT No.: PCT/JP2017/012268
§ 371 (c)(1),
(2) Date: Oct. 31, 2018

(87) PCT Pub. No.: WO2017/195482
PCT Pub. Date: Nov. 16, 2017

(65) Prior Publication Data
US 2019/0131258 A1    May 2, 2019

(30) Foreign Application Priority Data
May 10, 2016  (JP) ................................ 2016-094221

(51) Int. Cl.
*H01L 23/66*     (2006.01)
*H01L 23/498*    (2006.01)
(Continued)

(52) U.S. Cl.
CPC ............ *H01L 23/66* (2013.01); *H01L 21/486* (2013.01); *H01L 21/4853* (2013.01);
(Continued)

(58) Field of Classification Search
CPC ............... H01L 23/66; H01L 23/49822; H01L 23/49827; H01L 21/4853; H01L 21/486; H01L 24/16
See application file for complete search history.

(56) References Cited

U.S. PATENT DOCUMENTS

2003/0085471 A1* 5/2003 Iijima ............... H01L 23/49827
                                                      257/774
2003/0174479 A1* 9/2003 Shimura ................. H01L 23/66
                                                      361/764
(Continued)

FOREIGN PATENT DOCUMENTS

JP       2002-43718 A     2/2002
JP       2002-043718 A    2/2002
(Continued)

OTHER PUBLICATIONS

International Search Report and Written Opinion of PCT Application No. PCT/JP2017/012268, dated May 16, 2017, 05 pages of ISRWO, 01 page of translation.

*Primary Examiner* — Nathan W Ha
(74) *Attorney, Agent, or Firm* — Chip Law Group

(57) ABSTRACT

There is provided a semiconductor device that enables a semiconductor module that connects a wiring substrate and a semiconductor chip mounted on the wiring substrate via a circuit element and that has reduced a wiring length to improve transmission quality of signals or the like so as to achieve miniaturization of the semiconductor module. The semiconductor device includes a wiring substrate, a semiconductor chip disposed on an upper surface of the wiring substrate, a resin portion formed between the wiring substrate and the semiconductor chip, and a circuit element embedded in the resin portion. The circuit element includes a first terminal connected to wiring formed on the upper surface of the wiring substrate, and a second terminal (Continued)

connected to a bump provided on a lower surface of the semiconductor chip.

8 Claims, 4 Drawing Sheets

(51) Int. Cl.
*H01L 25/00* (2006.01)
*H01L 21/48* (2006.01)
*H01L 23/00* (2006.01)

(52) U.S. Cl.
CPC .. *H01L 23/49822* (2013.01); *H01L 23/49827* (2013.01); *H01L 24/16* (2013.01); *H01L 25/00* (2013.01); *H01L 24/13* (2013.01); *H01L 24/32* (2013.01); *H01L 24/73* (2013.01); *H01L 2223/6666* (2013.01); *H01L 2224/13101* (2013.01); *H01L 2224/16225* (2013.01); *H01L 2224/16227* (2013.01); *H01L 2224/73204* (2013.01); *H01L 2224/92125* (2013.01); *H01L 2924/1431* (2013.01); *H01L 2924/1434* (2013.01); *H01L 2924/15311* (2013.01); *H01L 2924/181* (2013.01)

(56) References Cited

U.S. PATENT DOCUMENTS

| | | | | |
|---|---|---|---|---|
| 2006/0065433 | A1* | 3/2006 | Danoski | H01L 23/66 174/255 |
| 2006/0180905 | A1* | 8/2006 | Zeng | H01L 23/49822 257/678 |
| 2007/0164429 | A1* | 7/2007 | Lee | H01L 23/49822 257/734 |
| 2007/0251719 | A1* | 11/2007 | Sturdivant | H01L 21/50 174/250 |
| 2008/0157294 | A1* | 7/2008 | Zeng | H01L 23/49827 257/659 |
| 2012/0133427 | A1* | 5/2012 | Kim | H01L 23/34 327/564 |
| 2012/0153445 | A1* | 6/2012 | Son | H01L 23/3128 257/668 |
| 2013/0307162 | A1* | 11/2013 | Shizuno | H01L 23/49827 257/774 |
| 2014/0021605 | A1* | 1/2014 | Yu | H01L 25/50 257/738 |
| 2014/0070423 | A1* | 3/2014 | Woychik | H01L 23/49833 257/774 |
| 2014/0131894 | A1* | 5/2014 | Yu | H01L 23/315 257/777 |
| 2014/0138845 | A1* | 5/2014 | Kulkarni | H01L 23/49822 257/774 |
| 2014/0167273 | A1* | 6/2014 | Kim | H01L 21/6836 257/773 |
| 2014/0185258 | A1* | 7/2014 | Lee | H01L 23/49822 361/761 |
| 2014/0293559 | A1* | 10/2014 | Suzuki | H01L 23/50 361/761 |
| 2014/0360765 | A1* | 12/2014 | Kiwanami | H05K 1/185 174/260 |
| 2014/0361410 | A1* | 12/2014 | Yamamichi | H01L 23/49838 257/621 |
| 2014/0374922 | A1* | 12/2014 | Huang | H01L 23/3128 257/777 |
| 2015/0070863 | A1* | 3/2015 | Yun | H05K 1/0306 361/767 |
| 2015/0282323 | A1* | 10/2015 | Shimizu | H01L 25/105 361/767 |
| 2016/0035678 | A1* | 2/2016 | Yoo | H01L 23/552 257/659 |
| 2016/0037630 | A1* | 2/2016 | Okamoto | H05K 3/4602 361/760 |
| 2016/0079149 | A1* | 3/2016 | Yoshida | H01L 23/49822 257/774 |
| 2016/0163628 | A1* | 6/2016 | We | H01L 23/49827 257/664 |
| 2017/0103943 | A1* | 4/2017 | Hu | H01L 23/31 |
| 2017/0278779 | A1* | 9/2017 | Hu | H01L 23/3128 |

FOREIGN PATENT DOCUMENTS

| | | |
|---|---|---|
| JP | 2005-150490 A | 6/2005 |
| JP | 2007-067234 A | 3/2007 |
| JP | 2008-198912 A | 8/2008 |

\* cited by examiner

SEMICONDUCTOR DEVICE, SEMICONDUCTOR DEVICE MANUFACTURING METHOD, AND ELECTRONIC DEVICE

CROSS REFERENCE TO RELATED APPLICATIONS

This application is a U.S. National Phase of International Patent Application No. PCT/JP2017/012268 filed on Mar. 27, 2017, which claims priority benefit of Japanese Patent Application No. JP 2016-094221 filed in the Japan Patent Office on May 10, 2016. Each of the above-referenced applications is hereby incorporated herein by reference in its entirety.

TECHNICAL FIELD

The present technology relates to a semiconductor device, a semiconductor device manufacturing method, and an electronic device.

BACKGROUND ART

Conventionally, there is a known semiconductor module in which a semiconductor chip and passive components are mounted on a wiring substrate. In such a semiconductor module, it is common that the semiconductor chip and the passive component are arranged two-dimensionally in the horizontal direction to be mounted on a mounting surface of the wiring substrate. Passive components need to be mounted with a certain interval between the semiconductor chip and the passive component so as to ensure reliability in solder printing and wire bonding of the semiconductor chip. For this reason, the wiring substrate tends to occupy a large area, making it difficult to miniaturize the semiconductor module.

Patent Document 1 discloses a semiconductor module in which a passive component is mounted while being connected to a wiring layer of a central main portion of a wiring substrate, a resin portion that seals the passive component is formed in a region where the passive component is mounted, a semiconductor chip is mounted above the resin portion, and an upper surface terminal of the semiconductor chip is connected with the wiring layer on the peripheral side of the wiring substrate using wires. In this manner, with arrangement of passive components three-dimensionally in a space between the wiring substrate and the semiconductor chip, it is possible to miniaturize the semiconductor module.

CITATION LIST

Patent Document

Patent Document 1: Japanese Patent Application Laid-Open No. 2007-67234

SUMMARY OF THE INVENTION

Problems to be Solved by the Invention

The above-described semiconductor module described in Patent Document 1, however, tends to have a long wiring length connecting the semiconductor chip and the passive elements mounted on the wiring substrate. This is due to the connection using wire bonding between the semiconductor chip and the wiring substrate. That is, the wiring length between the terminal of the semiconductor chip and the passive component connected to the wiring layer at the central main portion of the wiring substrate is a length obtained by adding a length of a wire extending from a terminal on an upper surface of the semiconductor chip toward the wiring on the lower wiring substrate in an arcuate shape and a wiring length of the wiring connecting the peripheral side and the central main portion on the wiring substrate.

In general, the wiring length between elements is preferably as short as possible, and it is particularly desirable to achieve a short distance connection between a bypass capacitor for removing radio frequency noise and a terminal of the semiconductor chip. This is because the longer the wiring length to connect between the bypass capacitor and the terminal of the semiconductor chip, the lower the effect of noise removal becomes.

With the technique in Patent Document 1 described above, it is difficult to shorten the wiring length between the terminal of the semiconductor chip and the passive components. In addition, the technique requires a space region for wire bonding on the wiring substrate, hindering the miniaturization of the whole semiconductor module.

The present technology has been made in view of the above problems, and aims to achieve a semiconductor module that connects a wiring substrate and a semiconductor chip mounted on the wiring substrate via a circuit element with a reduced wiring length to improve transmission quality of signals or the like and further aims to achieve miniaturization of the semiconductor module.

Solutions to Problems

An aspect of the present technology is a semiconductor device including: a wiring substrate; a semiconductor chip disposed on an upper surface of the wiring substrate so as to direct a bottom surface of the chip to face the upper surface; a resin portion formed between the wiring substrate and the semiconductor chip; and a circuit element embedded in the resin portion, in which the circuit element includes: a first terminal connected to wiring formed on the upper surface of the wiring substrate; and a second terminal connected to a bump provided on a lower surface of the semiconductor chip, and the circuit element is embedded in the resin portion with the first terminal facing the upper surface of the wiring substrate and the second terminal facing the lower surface of the semiconductor chip.

Another aspect of the present technology is a method for manufacturing a semiconductor device, the method including: a process of arranging a circuit element at least including a first terminal and a second terminal on a wiring substrate, with the first terminal facing an upper surface of the wiring substrate and with the second terminal being directed to a direction spaced away from the wiring substrate; a process of connecting and fixing the first terminal of the circuit element to wiring formed on the upper surface of the wiring substrate; a process of stacking a resin layer in which the circuit element is embedded on the upper surface of the wiring substrate; a process of forming redistribution wiring to be connected to the second terminal of the circuit element on the upper surface of the resin layer; and a process of connecting and fixing a bump of a semiconductor chip to the redistribution wiring on the upper surface of the resin layer.

Another aspect of the present technology is an electronic device including: a wiring substrate; a semiconductor chip disposed on an upper surface of the wiring substrate so as to direct a bottom surface of the chip to face the upper surface; a resin portion formed between the wiring substrate and the semiconductor chip; and a circuit element embedded in the resin portion, in which the circuit element includes: a first terminal connected to wiring formed on the upper surface of the wiring substrate; and a second terminal connected to a bump provided on a lower surface of the semiconductor chip, and the circuit element is embedded in the resin layer with the first terminal facing the upper surface of the wiring substrate and the second terminal facing the lower surface of the semiconductor chip.

Note that the semiconductor device and the electronic device described above include various modes such as being implemented in a state of being incorporated in another device or being implemented together with other methods. Furthermore, the above-described method for manufacturing a semiconductor device may be achieved in various modes such as: being implemented as a part of another method; being implemented with a semiconductor device manufacturing apparatus including means corresponding to each of steps; being implemented as a program for causing a computer to achieve functions corresponding to the configuration of the above-described manufacturing method; and being implemented as a computer-readable recording medium recording the program, for example.

Effects of the Invention

According to the present technology, it is possible to allow a semiconductor module that connects a wiring substrate and a semiconductor chip mounted on the wiring substrate via a circuit element to have a reduced wiring length to improve transmission quality of signals or the like and further possible to achieve miniaturization of the semiconductor module. Note that effects described in the present description are provided for purposes of exemplary illustration and are not intended to be limiting. Still other additional effects may also be contemplated.

MODE FOR CARRYING OUT THE INVENTION

Hereinafter, the present technology will be described in the following order.
(1) First embodiment:
(2) Second Embodiment:
(3) Third embodiment:

(1) First Embodiment

Figure 1:
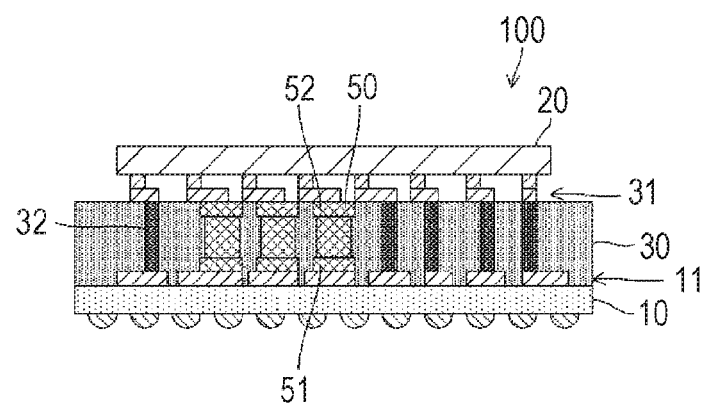
FIG. 1 is a diagram illustrating a schematic configuration of a semiconductor device according to a first embodiment.

FIG. 1 is a diagram illustrating a schematic configuration of a semiconductor device according to the present embodiment. A semiconductor module 100 as a semiconductor device according to the present embodiment includes a wiring substrate 10, a semiconductor chip 20, a resin portion 30, and a circuit element 50.

A wiring layer 11 is formed on an upper surface of the wiring substrate 10. The wiring formed in the wiring layer 11 includes, at its appropriate positions, pads for connecting and fixing the circuit element or the like by solder, etc. In the present embodiment, at least a pad on which a first terminal 51 of the circuit element 50 is to be connected and fixed with solder or the like and a pad for connecting one end portion of a through-substrate electrode 32 to be described below, are formed.

On a back surface of the wiring substrate 10, pads for forming and attaching a ball grid array (BGA) such as solder balls are formed as necessary. Each of the pads for BGA is either electrically connected to internal wiring of the wiring substrate 10 or electrically connected to the wiring layer 11 via the through-substrate electrode penetrating through the wiring substrate 10 or via a wire inserted through the through hole, etc.

The resin portion 30 is formed to have a constant thickness from the upper surface of the wiring substrate 10. The upper surface of the resin portion 30 is processed into a flat surface by polishing or grinding. An end portion (or an end surface) of a second terminal 52 of the circuit element 50 is exposed on the upper surface of the resin portion 30. Note that in the case of embedding a plurality of circuit elements 50 in the resin portion 30 in the present embodiment, it is assumed that the plurality of circuit elements 50 has substantially a same height, and the end portions (or the end surfaces) of the second terminals 52 of the plurality of circuit elements 50 are exposed on the upper surface of the resin portion 30.

The resin portion 30 is formed to have a thickness enough to include substantially the entire circuit element 50, and thus, substantially the entire circuit element 50 is embedded in the resin portion 30. The resin portion 30 has a thickness that allows the height of the upper surface of the resin portion 30 and the height of the upper end of the circuit element 50 embedded in the resin portion 30 to be substantially the same. With this configuration, the upper end (or the upper end surface) of the circuit element 50 is exposed from the upper surface of the resin portion 30.

A redistribution wiring layer 31 is formed on the upper surface of the resin portion 30. Pads are formed at appropriate positions in redistribution wiring constituting the redistribution wiring layer 31. In the present embodiment, at least pads for connecting and fixing the bumps of the semiconductor chip 20 with solder or the like are provided. The redistribution wiring formed in the redistribution wiring layer 31 includes at least redistribution wiring connected to the second terminal 52 of the circuit element 50 and redistribution wiring connected to the upper end of the through-substrate electrode 32 described below.

The through-substrate electrode 32 as the second through-substrate electrode is formed as necessary in a region of the resin portion 30 where the circuit element 50 is not embedded. The through-substrate electrode 32 has a shape extending along a direction substantially perpendicular to the upper surface of the wiring substrate 10 (thickness direction of the resin portion 30). The through-substrate electrode 32 vertically penetrates from the upper surface to the lower surface of the resin portion 30, with one end (lower end) being connected to the pad formed in the wiring layer 11 on the wiring substrate 10, and the other end (upper end) being connected to redistribution wiring of the redistribution wiring layer 31.

As described above, the redistribution wiring layer 31 is connected with the bump of the semiconductor chip 20, the second terminal 52 of the circuit element 50, and the upper end of the through-substrate electrode 32. In addition, the second terminal 52 of the circuit element 50 is connected to at least one of the bumps of the semiconductor chip 20 via the redistribution wiring, while the upper end of the through-substrate electrode 32 is also connected to at least one of the bumps of the semiconductor chip 20 via the redistribution wiring.

Therefore, the wiring length of the connection between the wiring substrate 10 and the semiconductor chip 20 via the circuit element 50 is as short as the length of the wiring length of the connection between the bump of the semiconductor chip 20 to be connected to the circuit element 50 in the redistribution wiring layer 31 and the second terminal 52. In this manner, the semiconductor module 100 according to the present embodiment can achieve the wiring length in the connection between the wiring substrate 10 and the semiconductor chip 20 via the circuit element 50 that is greatly shortened as compared with the conventional case, making it possible to enhance the transmission quality of a signal or the like transmitted through the wiring.

Figure 2:
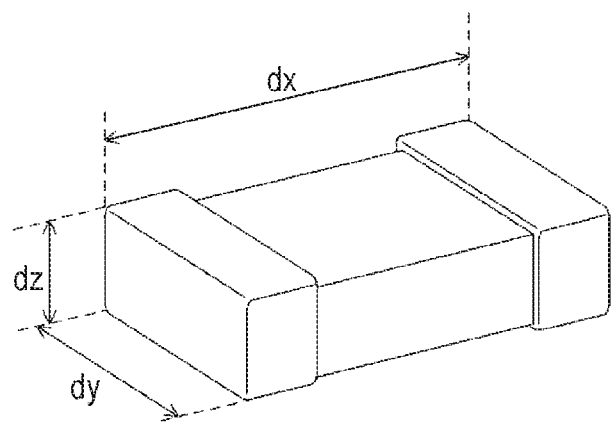
FIG. 2 is a diagram illustrating an example of a chip element.

Specific examples of the circuit element 50 include a chip element such as a chip capacitor or a chip resistor which is a surface mount component. FIG. 2 is a diagram illustrating an example of a chip element. The chip element typically has a flat rectangular parallelepiped shape. That is, in a case where a pair of rectangular surfaces which are not adjacent to each other and on which metal terminals are provided is defined as left and right surfaces, the shape is a rectangular parallelepiped having a longest left and right length dx, in which the rectangular surfaces as the left and right surfaces have one side (for example, a front-rear length dy) is longer than the other side (for example, the vertical length dz) (that is, dx>dy≥dz).

Each of the metal terminals provided on the left and right surfaces of the chip element is formed in a cap shape covering each of the surfaces and covering a certain range of an edge portion of its adjacent surface of the chip element. Conventionally, the chip element is arranged and mounted in a state where these cap-shaped metal terminals are in contact with mutually different lands and one of the upper and lower surfaces having the largest area in the chip element faces the upper surface of the wiring substrate 10 (that is, horizontal arrangement), and thus, the chip element occupies an area [dx×dy] on the wiring substrate 10.

In contrast, the semiconductor module 100 according to the present embodiment arranges the chip element to allow either one of the left and right sides of the narrowest area of the chip element to face the upper surface of the wiring substrate 10 to be mounted (that is, vertical mounting), and thus, the chip element merely occupies an area as small as about [dy×dz] (<[dx×dy]) on the wiring substrate 10. This makes it possible to miniaturize the semiconductor module 100 as compared with the conventional case, and also to achieve high integration of the elements of the semiconductor module 100.

Moreover, when the chip element is arranged and mounted on the wiring substrate 10, the metal terminals are mounted on the pads on the wiring substrate 10 such that the metal terminals formed in a certain range of the edge portion of the adjacent surface are individually in contact with different pads. Therefore, in a case where both left and right metal terminals are aligned and mounted on different pads on the wiring substrate 10 as in the conventional case, there is a possibility of occurrence of positional deviation, lifting, rising, etc. of components during melting and solidification of cream solder or the like coated on the pads by a reflow process or the like and during subsequent soldering of the connection between the metal terminal and the land.

In contrast, the semiconductor module 100 according to the present embodiment arranges only the one of the left and right metal terminals on the pad on the wiring substrate 10 with vertically arranging the chip element, and the cream solder or the like applied on the pad is melted and solidified by a reflow process or the like so as to connect the metal terminal and the pad by solder. With this arrangement, it is possible to suppress occurrence of positional deviation of the components and even when positional deviation occurs, its influence would be small as compared with the conventional case, and there is no possibility of occurrence of lifting or rising of the components.

Figure 3:
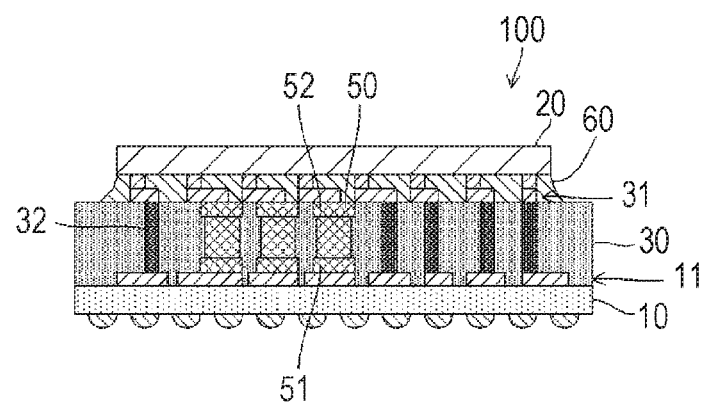
FIG. 3 is a diagram illustrating another example of the semiconductor device according to the first embodiment.

In addition, as illustrated in FIG. 3, an underfill material 60 may be filled in a gap between the semiconductor chip 20 and the resin portion 30 (gap between the bumps). This would improve the integrity of the semiconductor chip 20 and the resin portion 30 and ensure the connection between the bump and the redistribution wiring layer 31, leading to enhanced reliability of the semiconductor module 100.

Figure 4:
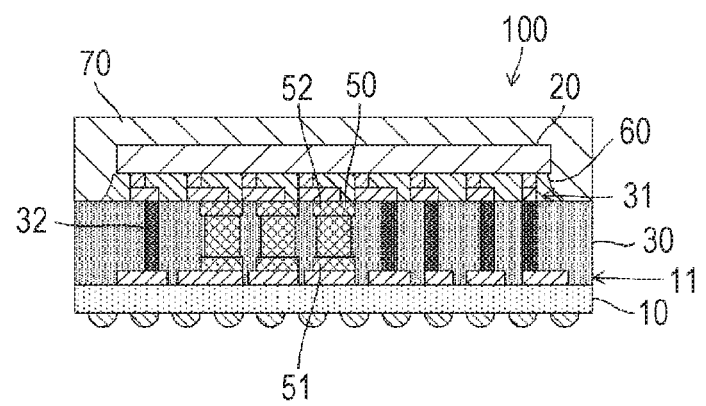
FIG. 4 is a diagram illustrating still another example of the semiconductor device according to the first embodiment.
Figure 5:
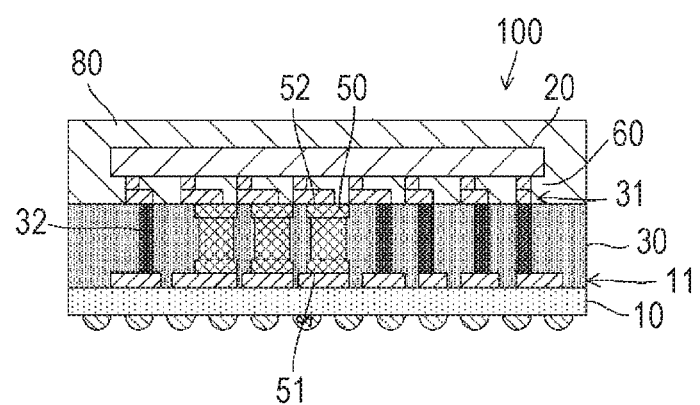
FIG. 5 is a diagram illustrating still another example of the semiconductor device according to the first embodiment.

Furthermore, after the underfill material 60 is filled in the gap between the semiconductor chip 20 and the resin portion (gap between the bumps), the semiconductor chip 20 may be sealed with a mold resin 70 from above the resin portion 30 as illustrated in FIG. 4. Alternatively, instead of filling the gap between the semiconductor chip 20 and the resin portion 30 (bump gap) with the underfill material, filling of the gap between the semiconductor chip 20 and the resin portion 30 (gap between the bumps) and resin sealing from the top of the resin portion 30 to the semiconductor chip 20 may be performed in one step using a mold underfill material 80 as illustrated in FIG. 5.

Figure 6:
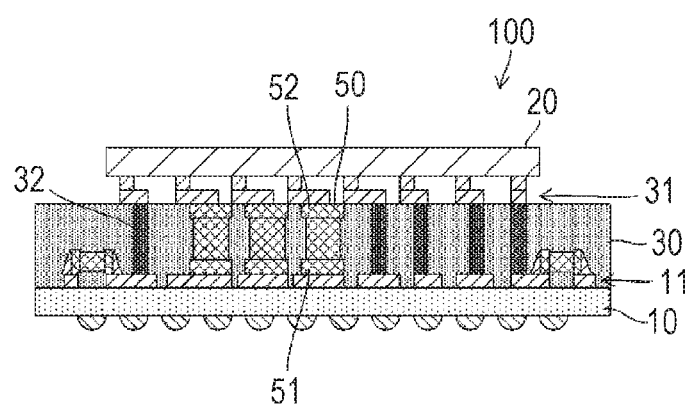
FIG. 6 is a diagram illustrating still another example of the semiconductor device according to the first embodiment.
Figure 7:
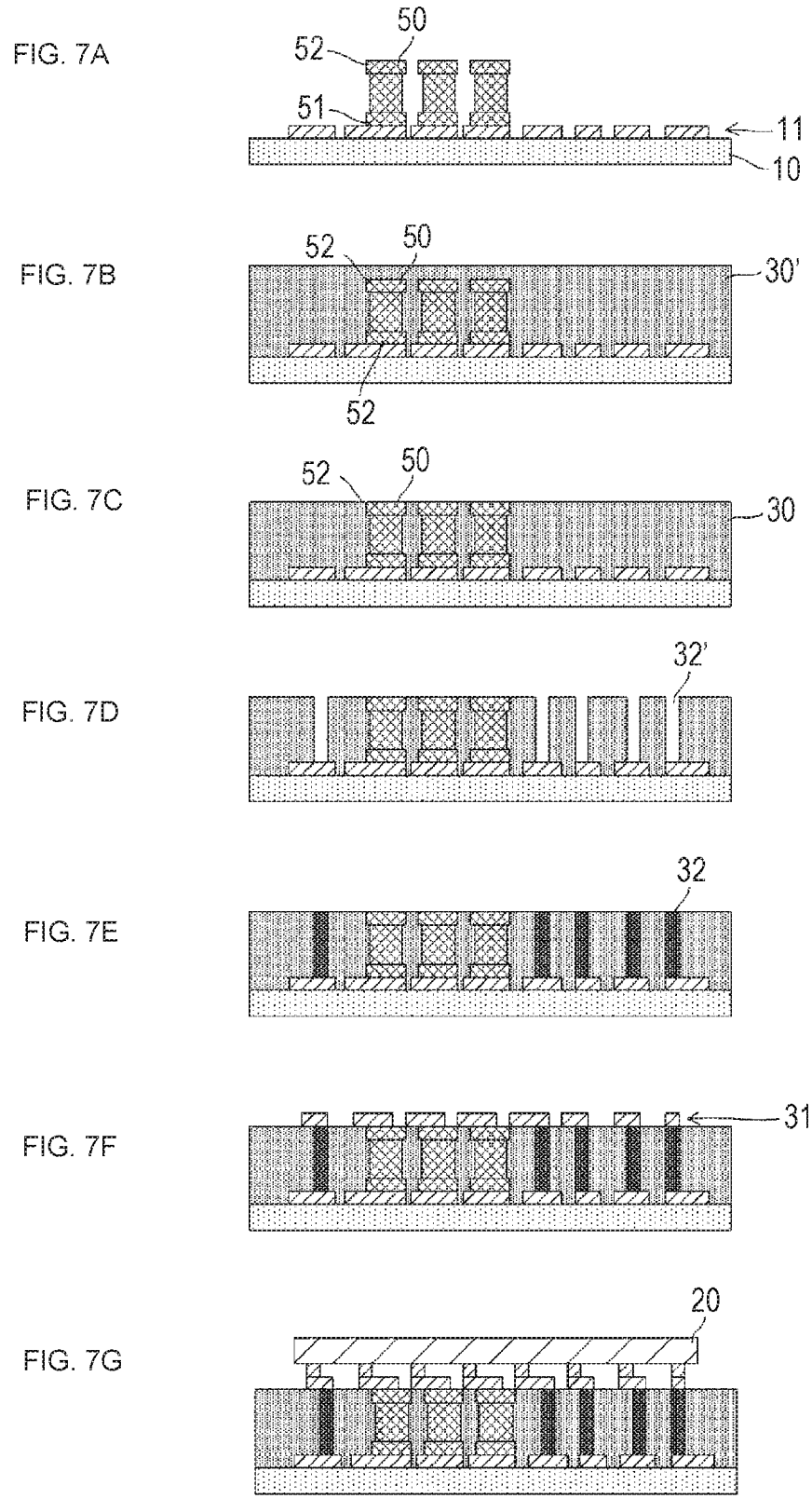
FIGS. 7A, 7B, 7C, 7D, 7E, 7F, and 7G are diagrams illustrating individual steps related to manufacturing of a semiconductor module.

Furthermore, the circuit element 50 may partially be horizontally arranged on an outer position of the semiconductor chip 20 of the wiring substrate 10 as illustrated in FIG. 6, in addition to the circuit element 50 being vertically arranged between the semiconductor chip 20 and the wiring substrate 10. In this manner, with the use of the mode of arranging the circuit element 50 vertically between the semiconductor chip 20 and the wiring substrate 10 together with the mode of arranging it horizontally outside the semiconductor chip 20, it is possible to enhance the degree of freedom of design.

Hereinafter, a method of manufacturing the semiconductor module 100 will be described.

FIGS. 7A, 7B, 7C, 7D, 7E, 7F, and 7G are diagrams illustrating individual steps related to the manufacture of the semiconductor module 100. Note that while FIGS. 7A, 7B, 7C, 7D, 7E, 7F, and 7G illustrate one semiconductor module 100 alone, actual manufacturing includes production of a plurality of chips in a state of an aggregate substrate including the wiring substrates 10 being joined with each other. BGA is formed on a bottom surface of the aggregate substrate, and thereafter, the aggregate substrate is diced into individual wiring substrates 10.

First, the circuit element 50 is mounted on the wiring substrate 10. Specifically, the first terminal 51 being one terminal of the circuit element 50 is connected and fixed to a predetermined pad of the wiring layer 11 with solder or the like. For example, a cream solder is applied to a predetermined pad, then, the circuit element 50 is erected while the first terminal 51 is abutted against the cream solder in a direction of allowing the second terminal 52 to be spaced away from the wiring substrate 10 while allowing the first terminal 51 to face the upper surface of the wiring substrate 10, and the solder is melted and solidified by reflowing.

At this time, the second terminal 52 which is the other terminal of the circuit element 50 is not facing the wiring substrate 10, and is located at a position farthest from the upper surface of the wiring substrate 10, and thus, naturally the second terminal 52 as the other terminal of the circuit element 50 is not connected to the wiring substrate 10. For example, in a case where the circuit element 50 is constituted with the above-described chip element, the circuit element 50 is fixed on the wiring substrate 10 in a vertically mounted state when the metal terminal on the left side is connected and fixed to a predetermined pad of the wiring layer 11. In this state, the metal terminal on the right side is not facing the upper surface of the wiring substrate 10 and is positioned farthest from the upper surface of the wiring substrate 10.

Next, a sealing resin is deposited on the wiring substrate 10 to form a resin portion 30'. The resin portion 30' is deposited to such a height as to include the entire circuit element 50 and deposited to such a degree as to be contained in the resin portion 30' including the second terminal 52 of the circuit element 50. That is, the circuit element 50 is temporarily embedded in an unexposed state in the resin portion 30' including the second terminal 52.

Next, the upper surface of the resin portion 30' is polished or ground to be planarized to expose the second terminals 52 of the circuit element 50 so as to form the resin portion 30.

Next, a through hole 32' to vertically penetrate the resin portion 30 is formed in the resin portion 30. The through hole 32' is formed by laser emission, for example. Specifically, a laser is emitted substantially perpendicularly to the upper surface of the wiring substrate 10 toward the pad of the wiring layer 11 to which the through-substrate electrode 32 is to be connected. With this operation, the through hole 32' communicating between the upper surface side of the resin portion 30 and the pad of the wiring layer 11 is formed so as to linearly extend along the direction substantially perpendicular to the upper surface of the wiring substrate 10.

Next, a resist is formed to cover the upper surface of the resin portion 30 except the opening portion of the through hole 32', and then, a metal such as Cu is embedded and filled from the upper surface side of the resin portion 30 by plating, for example. This operation forms the through-substrate electrode 32 linearly extending in the direction perpendicular to the upper surface of the wiring substrate 10, leading to formation of wiring electrically connecting the upper surface side of the resin portion 30 and the pad of the wiring layer 11.

Next, the redistribution wiring layer 31 is formed on the upper surface of the resin portion 30 using a redistribution processing technique. The redistribution wiring layer 31 includes a bud used for connection with the bump of the semiconductor chip 20 mounted on the redistribution wiring layer 31. The redistribution wiring constituting the redistribution wiring layer 31 is formed so as to connect between the pad for bump connection and either the first terminal 51 of the circuit element 50 or the upper end of the through-substrate electrode 32. Thereafter, a protective layer 33 (not illustrated) including polyimide or the like is formed on the redistribution wiring layer 31, and then, a site covering the pad for bump connection is removed by etching to expose the pad.

Next, the bumps of the semiconductor chip 20 are individually aligned with the positions of the pads for bump connection to arrange the semiconductor chip 20 on the redistribution wiring layer 31, allowing flip-chip mounting of the semiconductor chip 20. Thereafter, BGA is attached to the pad on the back surface of the wiring substrate 10. With the above-described manufacturing method, the above-described semiconductor module 100 can be produced.

Figure 8:
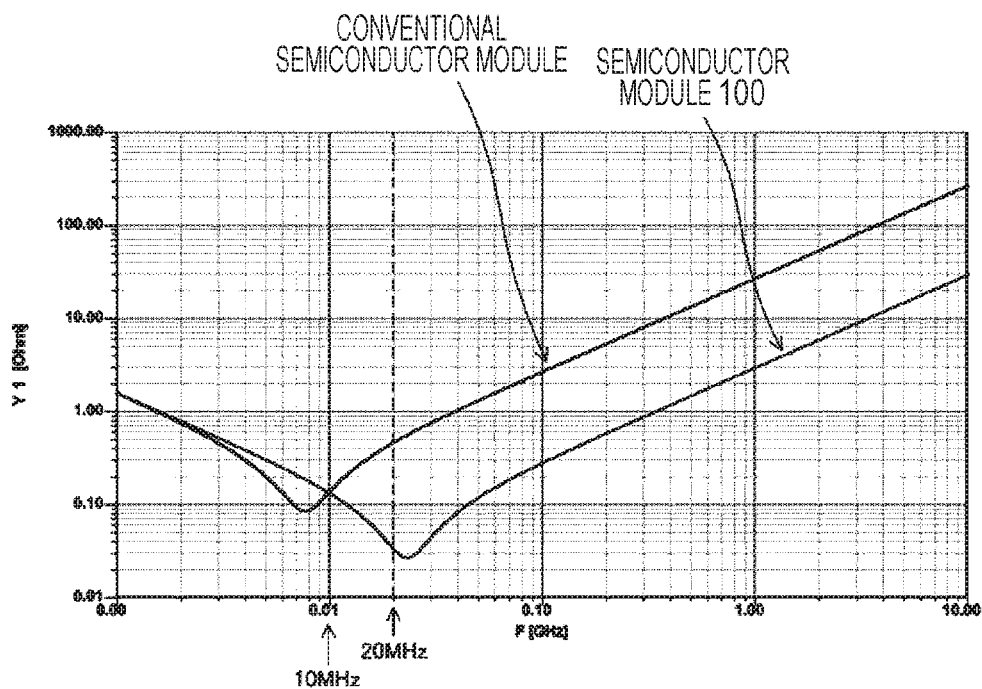
FIG. 8 is a simulation result of comparing an input impedance in wiring via a power supply bypass capacitor between a semiconductor module adopting connection with a conventional wire bonding method and a semiconductor module according to the first embodiment.

Next, an exemplary embodiment of the above-described semiconductor module 100 will be described. FIG. 8 is a simulation result of comparing an input impedance in a power supply line to the semiconductor chip 20 being a line in which a power supply bypass capacitor is interposed, in a semiconductor module adopting connection with a conventional wire bonding method and in the semiconductor module 100 according to the present embodiment.

In the conventional semiconductor module, a power supply bypass capacitor is disposed on the wiring substrate 10 under the semiconductor chip 20, and wire bonding is used for connection between the semiconductor chip 20 and the wiring substrate 10. In the semiconductor module having connection using the conventional wire bonding method, the diameter of the wire used is 20 μm and the length is 0.8 mm. For each of the wiring and redistribution wiring, the width is 0.24 mm, the length is 4 mm, and the thickness is 18 μm. In addition, each of the bumps of the semiconductor chip 20 has a diameter of 40 μm and a height of 50 μm. The capacity of the power supply bypass capacitor is each set to 100 pF.

As a result, it can be seen that the semiconductor module 100 according to the present embodiment achieves input impedance lower than that of a semiconductor module connected by a conventional wire bonding method in a high frequency region of 10 Mhz or more, and furthermore, it achieves, in a high frequency region of 20 MHz or more, input impedance suppressed to about $\frac{1}{10}$ of that of the semiconductor module connected by the conventional wire bonding method. That is, it can be seen that reduction in the wiring length between the wiring substrate 10 and the semiconductor chip 20 connected via the circuit element 50 improves the transmission quality of signals or the like.

(2) Second Embodiment

Figure 9:
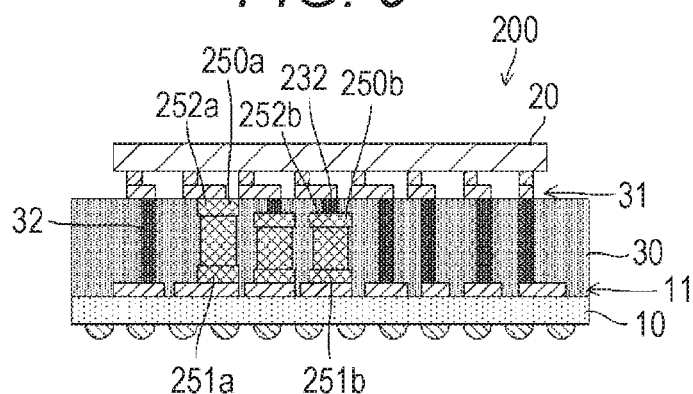
FIG. 9 is a diagram illustrating a schematic configuration of a semiconductor device according to a second embodiment.

FIG. 9 is a diagram illustrating a schematic configuration of a semiconductor device according to the present embodiment. A semiconductor module 200 as a semiconductor device according to the present embodiment is similar to the semiconductor module 100 according to the first embodiment except that the circuit elements 50 arranged vertically between the wiring substrate 10 and the semiconductor chip 20 have a plurality of different heights. Accordingly, same reference numerals are given and the detailed description is omitted.

The semiconductor module 200 includes circuit elements 250a and 250b having mutually different heights. The circuit element 250a has a length from a first terminal 251a to a second terminal 252a substantially equal to a thickness of the resin portion 30 while the circuit element 250b has a length from a first terminal 251b to a second terminal 252b shorter than the thickness of the resin portion 30.

Therefore, the semiconductor module 200 has a configuration in which the circuit element 250b having the length from the first terminal 251b to the second terminal 252b shorter than the thickness of the resin portion 30 is provided with a through-substrate electrode 232 as a first through-substrate electrode similar to the through-substrate electrode 32 described above, formed between the upper surface of the resin portion 30 and the first terminal 251b. With this configuration, even in a case where the inter-terminal lengths of the circuit elements arranged between the semiconductor chip 20 and the wiring substrate 10 have variation, it is possible to implement all of these circuit elements in vertical arrangement, enabling reduction of the wiring length between the semiconductor chip 20 and the wiring substrate 10 as compared with the conventional case.

(3) Third Embodiment

Figure 10:
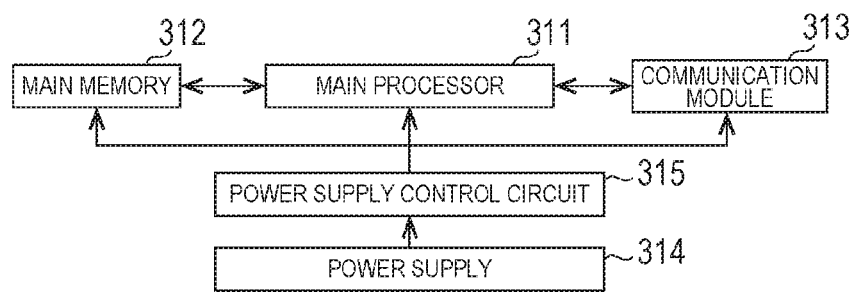
FIG. 10 is a block diagram illustrating a hardware configuration of a portable communication terminal as an example of an electronic device.

FIG. 10 is a block diagram illustrating a hardware configuration of a portable communication terminal 300 as an example of an electronic device including the above-described semiconductor module 100 or 200. The portable communication terminal 300 is a portable information processing device such as a smartphone or a portable game machine, for example.

The portable communication terminal 300 includes a main processor 311, a main memory 312, a communication module 313, a power supply 314, and a power supply control circuit 315. For example, the configuration of the semiconductor module 100 or 200 described above can be adopted as the main processor 311 and the communication module 313.

The main processor 311 executes a variety of information processing according to a program stored in the main memory 312. For example, the communication module 313 executes a variety of processing using data received from another portable communication terminal.

The main memory 312 includes a memory element such as a random access memory (RAM) and stores a program to be executed by the main processor 311. In addition, the main memory 312 also operates as a work memory of the main processor 311.

The communication module 313 performs wireless data communication with another communication device according to an instruction from the main processor 311. This wireless data communication can be implemented by various methods such as a wireless local area network (LAN) based on The Institute of Electrical and Electronics Engineers, Inc. (IEEE) 802.11 standard and Bluetooth (registered trademark).

The power supply 314 is a secondary battery or the like and supplies electric power necessary for operation of the portable communication terminal 300. The power supply control circuit 315 transforms electric power supplied from the power supply 314 as necessary and supplies it to individual units of the portable communication terminal 300. At this time, electric power is supplied to the main processor 311 and the communication module 313 adopting the configuration of the semiconductor module 100 or 200 via the vertically arranged power supply bypass capacitor.

Note that the present technology is not limited to each of the above-described embodiments and includes configurations including mutual replacement or various modifications of combinations of individual formations disclosed in the above embodiments, configurations including mutual replacement or various modifications of combinations of individual formations disclosed in known technologies and the above embodiments, or the like. Furthermore, the technical scope of the present technology is not limited to the above-described embodiments, but extends to matters described in the claims and their equivalents.

Moreover, the present technology may also be configured as below.

(1)

A semiconductor device including:

a wiring substrate;

a semiconductor chip disposed on an upper surface of the wiring substrate so as to direct a bottom surface of the chip to face the upper surface;

a resin portion formed between the wiring substrate and the semiconductor chip; and a circuit element embedded in the resin portion, in which the circuit element includes: a first terminal connected to wiring formed on the upper surface of the wiring substrate; and a second terminal connected to a bump provided on a lower surface of the semiconductor chip, and the circuit element is embedded in the resin portion with the first terminal facing the upper surface of the wiring substrate and the second terminal facing the lower surface of the semiconductor chip.

(2)

The semiconductor device according to (1), in which the second terminal is connected to the bump via redistribution wiring formed along an upper surface of the resin portion.

(3)

The semiconductor device according to (1) or (2), in which the second terminal is connected to the bump of the semiconductor chip via a first through-substrate electrode formed in a through hole extending from the upper surface of the resin portion to the second terminal of the circuit element.

(4)

The semiconductor device according to any one of (1) to (3), in which the circuit element is a surface mount component.

(5)

The semiconductor device according to any one of (1) to (4), in which the circuit element is a power supply bypass capacitor interposed on a power supply line to the semiconductor chip.

(6)

The semiconductor device according to any one of (1) to (5), further including a second through-substrate electrode formed in a through hole extending from an upper surface of the resin portion to wiring formed on the upper surface of the wiring substrate, in which the second through-substrate electrode connects the wiring formed on the upper surface of the wiring substrate and the bump of the semiconductor chip.

(7)

A method for manufacturing a semiconductor device, the method including:

a process of arranging a circuit element at least including a first terminal and a second terminal on a wiring substrate, with the first terminal facing an upper surface of the wiring substrate and with the second terminal being directed to a direction spaced away from the wiring substrate;

a process of connecting and fixing the first terminal of the circuit element to wiring formed on the upper surface of the wiring substrate;

a process of stacking a resin layer in which the circuit element is embedded on the upper surface of the wiring substrate;

a process of forming redistribution wiring to be connected to the second terminal of the circuit element on the upper surface of the resin layer; and a process of connecting and fixing a bump of a semiconductor chip to the redistribution wiring on the upper surface of the resin layer.

(8)

An electronic device including:

a wiring substrate;

a semiconductor chip disposed on an upper surface of the wiring substrate so as to direct a bottom surface of the chip to face the upper surface;

a resin portion formed between the wiring substrate and the semiconductor chip; and a circuit element embedded in the resin portion, in which the circuit element includes: a first terminal connected to wiring formed on the upper surface of the wiring substrate; and a second terminal connected to a bump provided on a lower surface of the semiconductor chip, and the circuit element is embedded in the resin layer with the first terminal facing the upper surface of the wiring substrate and the second terminal facing the lower surface of the semiconductor chip.

REFERENCE SIGNS LIST

10 Wiring substrate
11 Wiring layer
20 Semiconductor chip
30 Resin portion
30' Resin portion
31 Redistribution wiring layer
32 Through-substrate electrode
32' Through hole
33 Protective layer
50 Circuit element
51 First terminal
52 Second terminal
60 Underfill material
70 Mold resin
80 Mold underfill material
100 Semiconductor module
200 Semiconductor module
232 Through-substrate electrode
250a Circuit element
250b Circuit element
251a First terminal
251b First terminal
252a Second terminal
252b Second terminal
300 Portable communication terminal
311 Main processor
312 Main memory
313 Communication module
314 Power supply
315 Power supply control circuit

The invention claimed is:

1. A semiconductor device, comprising:
a wiring substrate;
a wiring layer on an upper surface of the wiring substrate;
a semiconductor chip on the wiring layer, wherein a lower surface of the semiconductor chip faces the upper surface of the wiring substrate;
a bump on the lower surface of the semiconductor chip;
a resin portion between the wiring substrate and the semiconductor chip; and
a circuit element, wherein
an entirety of the circuit element is inside the resin portion,
the circuit element includes:
a first terminal connected to the wiring layer; and
a second terminal connected to the bump, and
the first terminal faces the upper surface of the wiring substrate and the second terminal faces the lower surface of the semiconductor chip.

2. The semiconductor device according to claim 1, wherein
the second terminal is connected to the bump via redistribution wiring, and
the redistribution wiring is along an upper surface of the resin portion.

3. The semiconductor device according to claim 1, wherein
the second terminal is connected to the bump via a first through-substrate electrode, and
the first through-substrate electrode is in a through hole that extends from the upper surface of the resin portion to the second terminal of the circuit element.

4. The semiconductor device according to claim 1, wherein the circuit element is a surface mount component.

5. The semiconductor device according to claim 1, wherein
the circuit element is a power supply bypass capacitor, and
the power supply bypass capacitor is on a power supply line to the semiconductor chip.

6. The semiconductor device according to claim 1, further comprising a second through-substrate electrode in a through hole, wherein
the through hole extends from an upper surface of the resin portion to the wiring layer, and
the second through-substrate electrode connects the wiring layer and the bump.

7. A method for manufacturing a semiconductor device, the method comprising:
arranging a circuit element on a wiring substrate, wherein
the circuit element includes a first terminal and a second terminal on a wiring substrate,
the first terminal faces an upper surface of the wiring substrate, and
the second terminal is directed to a direction spaced away from the wiring substrate;
connecting and fixing the first terminal to a wiring layer, wherein the wiring layer is on the upper surface of the wiring substrate;
stacking a resin layer on the upper surface of the wiring substrate, wherein an entirety of the circuit element is inside the resin layer;
forming redistribution wiring connected to the second terminal on the upper surface of the resin layer; and
connecting and fixing a bump of a semiconductor chip to the redistribution wiring on the upper surface of the resin layer.

8. An electronic device, comprising:
a semiconductor device, wherein the semiconductor device comprises:
a wiring substrate;
a wiring layer on an upper surface of the wiring substrate;

a semiconductor chip on the wiring layer, wherein a lower surface of the semiconductor chip faces the upper surface of the wiring substrate;
a bump on the lower surface of the semiconductor chip;
a resin portion between the wiring substrate and the semiconductor chip; and
a circuit element, wherein
an entirety of the circuit element is inside the resin portion,
the circuit element includes:
a first terminal connected to the wiring layer; and
a second terminal connected to the bump, and
the first terminal faces the upper surface of the wiring substrate and the second terminal faces the lower surface of the semiconductor chip.

* * * * *